United States Patent [19]

Sato et al.

[11] Patent Number: 4,899,148
[45] Date of Patent: Feb. 6, 1990

[54] DATA COMPRESSION METHOD

[75] Inventors: Takuro Sato; Yoshihito Shimazaki; Manabu Kawabe, all of Tokyo, Japan

[73] Assignee: Oki Electric Industry Co., Ltd., Tokyo, Japan

[21] Appl. No.: 157,691

[22] Filed: Feb. 19, 1988

[30] Foreign Application Priority Data

Feb. 25, 1987 [JP] Japan .................................. 62-40453
Feb. 25, 1987 [JP] Japan .................................. 62-4054

[51] Int. Cl.$^4$ ............................................. H03M 7/40
[52] U.S. Cl. ...................................... 341/65; 341/51; 358/261.3
[58] Field of Search ................... 341/51, 55, 59, 64, 341/65, 67, 95, 106, 107; 358/133, 260-263

[56] References Cited

U.S. PATENT DOCUMENTS 4,420,771 12/1983 Pirsch ..................................... 341/56
4,700,175 10/1987 Bledsoe .................................. 341/65
4,796,003 1/1989 Bently et al. .......................... 341/95
4,847,619 7/1989 Kato et al. ........................ 341/51 X

OTHER PUBLICATIONS

Variations on a Theme by Huffman, Robert B. Gallager; IEEE Transactions of Information Theory; vol. IT-24, No. 6, Nov. 1978; pp. 668-674.

Primary Examiner—William M. Shoop, Jr.
Assistant Examiner—Brian K. Young
Attorney, Agent, or Firm—Spencer & Frank

[57] ABSTRACT

In a method of compressing text data including codewords of characters, an input word each composed of a series of codewords of one or more characters is extracted from the text data, a dictionary containing, as entries, words made up of characters is provided, a codeword is stored in association with each word, occurrence counts of respective words are also stored, the dictionary is searched to find whether or not the input word matches any of the words, the codeword assigned to the word which the input word has been found to match is produced, the occurrence count of the word which the input word has been found to match is updated; and when the input word is not found to match any of the words, the input word is introduced as a new word.

4 Claims, 7 Drawing Sheets

FIG.6

LENGTH: 2 CHARACTERS OR GREATER

| HEADER | WORD | COMPRESSED CODEWORD | OCCURRENCE COUNT | WEIGHT | | |
|---|---|---|---|---|---|---|
| | $A_1$ | $B_1$ | $C_1$ | $W_2$ | $P_2$ | |
| | $A_2$ | $B_2$ | $C_2$ | $W_0$ | $P_0$ | |
| | $A_3$ | $B_3$ | $C_3$ | $W_0$ | $P_0$ | |
| | $A_4$ | $B_4$ | $C_5$ | $W_0$ | $P_0$ | |
| | ----- | ----- | ----- | ----- | ----- | |

LENGTH: 1 CHARACTER

| HEADER | | | | | |
|---|---|---|---|---|---|
| | $A_5$ | $B_5$ | $C_1$ | $W_0$ | $P_0$ |
| | $A_6$ | $B_6$ | $C_6$ | $W_1$ | $P_1$ |
| | ----- | ----- | ----- | ----- | ----- |

HEADER

DATA COMPRESSION METHOD

BACKGROUND OF THE INVENTION

This invention relates to a method of compressing text data (data representing sentences, programs or the like) transmitted between computers or terminals.

An example of an existing compression method of this type is described in *Nikkei Electronics*, No. 403, September 8, 1986, p. 288.

FIG. 1 is a block diagram of one possible configuration of this existing data compression method, comprising a transmitting terminal 21, a compressive data coding apparatus 2 including a searching means 22, a first dictionary 23, a second dictionary 24, a modulator 25, a transmission channel 26, a demodulator 27, a decoding apparatus 20 including a searching means 28, a first dictionary 29 and a second dictionary 210 corresponding to the first and second dictionaries 23 and 24 at the transmitting end, and a receiving terminal 211. A word sent by the terminal 21 consists of several characters. The searching means 22 in the compressive data coding apparatus 2 searches the first dictionary 23 to see if it contains an entry for the input word. If it does, data corresponding to this existing entry are output. If the word cannot be found in the first dictionary 23, data corresponding to the constituent letters of the word are output from the second dictionary 24. In this way compressed data are sent via the modulator 25 to the transmission channel 26. At the receiving end, first the data are demodulated by the demodulator 27. Using the first dictionary 29 and the second dictionary 210, the searching means 28 converts the demodulated data to codes suitable for the terminal 211.

The data can be compressed most effectively if the first dictionary contains a large number of words and relatively short data "words" (i.e., each data "word" in this instance has a predetermined number of bits, each such data "word" having the same length) are assigned to each, so it is common for about 16 bits to be assigned to each word thereby providing an available $2^{16}$ (which equals 65,536) words. In the second dictionary, it is common for about 8 bits to be assigned per character (providing an available $2^8$ (which equals 256) characters.

Since the first dictionary 23 contains some sixty thousand words, it takes considerable time to search the first dictionary 23 for the word corresponding to the data input from the terminal 21, making it impossible for the compression process to be performed in real time at high data transmission rates. Another problem is that the dictionary requires a large memory space, hence a large amount of hardware, in which to store the large number of words.

Another example of a known compressed coding method is the adaptive Huffman method as disclosed in *IEEE Transactions on Information Theory* Vol. IT-24, No. 6, November 1987, pp. 668 to 674.

FIG. 2 shows the tree structure of an adaptive Huffman coding method for data words $A_3$ to $A_6$.

With reference to FIG. 2, the branches of the tree structure are labeled by the symbols 0 and 1, and each node except the root (r) is assigned a number in decreasing order of occurrence probability. The node numbers $q_1$ to $q_{10}$ are grouped hierarchically into sibling pairs: $q_1$, $q_2$; $q_3$, $q_4$; ... $q_9$, $q_{10}$.

When the word $A_6$, expressed as a combination of letters, is given as input, a compressed codeword is generated by tracing the path from the bottom node $q_{10}$ linked to the word $A_6$ to the root (r); then the occurrence count of the node number $q_{10}$ is updated by being incremented by 1.

Now, the occurrence count of the sibling pair one level above the sibling pair containing the word $A_6$ is checked and compared with the occurrence count just updated. If it is found that the size relationship has been reversed, words and occurrence counts are switched between the bottom node ($q_5$) of the pair and node $q_{10}$, then the occurrence counts of the nodes on the route from node $q_{10}$ to the root node (nodes $q_2$ and $q_6$) are incremented by 1. The switch has the effect of switching the initially assigned compressed codes to take account of the statistical properties of the transmitted data.

In adaptive Huffman coding, an increase in the number of words (bottom nodes) generally causes an exponential increase in the number of tree branches, so considerable hardware is required and it takes time to find the bottom node and generate the codeword by tracing the tree structure.

SUMMARY OF THE INVENTION

An object of the present invention is to reduce the search time and the dictionary memory space compared with the prior art method and provide a more efficient method of data compression.

Another object of the present invention is to provide a method of compressive coding under restricted conditions through a process that generates compressed codewords for words not represented among the bottom nodes of the tree structure.

According to the invention at the coding end, the frequency of occurrence of words input from the terminal is calculated, codewords or data of the optimum length according to the frequency of occurrence are assigned, and a new word is entered in case the input word is not found in the existing dictionary. At the decoding end, similar steps are provided: The frequency of occurrence of the demodulated word is calculated. A codeword or data of the optimum length is assigned according to the frequency of occurrence. The same new word as at the coding end is entered.

In the above arrangement, new words input from the terminal are added to the existing dictionary, their frequency of occurrence is compared with all the existing words, and a codeword of the optimum length is assigned according to the frequency of occurrence as described above. Highly efficient data compression is thus possible using only a small dictionary.

In a preferred embodiment of the invention, the dictionary contains, in addition to ordinary words, pseudo-words having various fixed lengths, including lengths of one and two characters. When an input word is not found to be present in the dictionary, it is subdivided into segments of a fixed length, and a search is made for the segments in the dictionary. If each of the segments does not have a matching entry in the dictionary, the segment is divided into segments of shorter length or of a smaller number of characters. In this way, the number of characters per segment is successively reduced until the search succeeds. The output consists of the compressed codewords stored in the dictionary for the words found by the search. The compressed codewords stored in the dictionary are updated according to occurrence counts.

BRIEF DESCRIPTION OF THE DRAWINGS

FIG. 6 is an explanatory diagram of the dictionary.

DETAILED DESCRIPTION OF THE PREFERRED EMBODIMENTS

Figure 3:
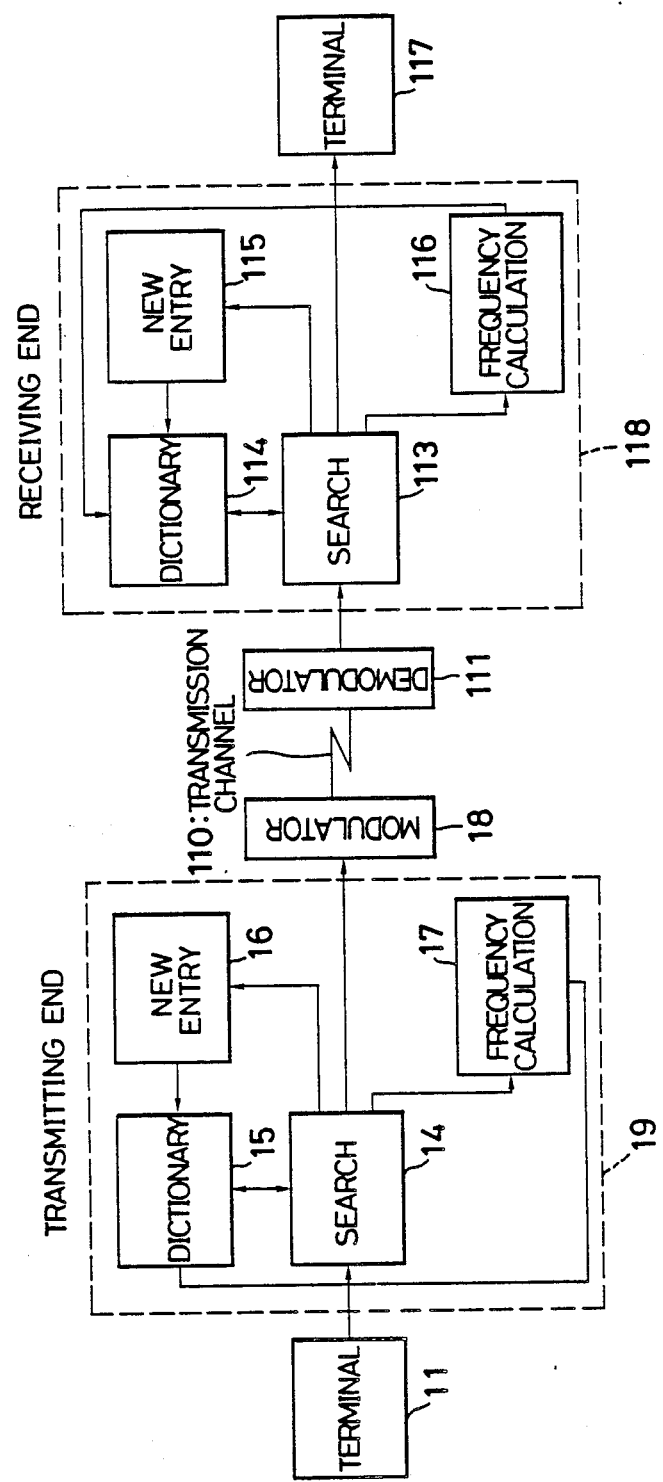
FIG. 3 is a block diagram for explaining an embodiment of the data compression method of this invention.

FIG. 3 is a block diagram of an embodiment of the present invention, comprising, at the transmitting end, transmitting terminal 11, a compressive data coding apparatus 19 including a searching means 14 for selecting from a dictionary words matching the words input from the terminal, dictionary 15 in which the words already entered and the letters are stored corresponding to their frequency of occurrence, a new-word entry means 16 for entering input data not already stored in the dictionary as new words and an occurrence frequency calculation means 17 for counting the frequency of occurrence of words or letters corresponding to the input data from the terminal 11, and a modulator 18 for sending codewords corresponding to the words of letters selected by the searching means 14 on a transmission channel 110; and, at the receiving end, a receiving demodulator 111, a searching means 113 for searching a dictionary for the demodulated data, a dictionary 114 of words and letters, a new-word entry means 115 for storing new entries for words not present in the dictionary, an occurrence frequency calculation means 116 for calculating the frequency of words and letters in the output data from the demodulator 111, and a receiving terminal 117.

Newspaper and magazine articles on a single subject employ a vocabulary of only about two or three thousand words, and the words that occur frequently are fairly limited. It is therefore sufficient for the dictionary 15 to start out with two or three thousand words. In a given article, however, proper nouns of special words related to the subject of the article occur with high frequency. These proper nouns and special words are nearly absent in other articles. Accordingly, to assign codewords or data to all the words in an article and obtain a high data compression ratio, each time the terminal sends a word not in the dictionary, the word is entered as a new word in the dictionary, and the next time the same new word is input, it is assigned a codeword of the optimum data length as a single word.

The operation of this invention will be explained with reference to FIG. 3. The searching means 14 searches among the words already stored in the dictionary 15 for the words output from the terminal 11. If it finds a word already entered in the dictionary 15, it selects the corresponding codeword from the dictionary 15 and sends it to the modulator 18. At the same time, the occurrence frequency calculation means 17 calculates the frequency of use of the word. If the frequency of use of the same word rises, it is assigned a shorter codeword in keeping with its frequency of use. Optimum coding is possible if the Huffman coding method is used to assign the codewords.

If the searching means 14 fails to find a word output from the terminal 11 in the dictionary 15, the word is dissected into letters. English contains only 26 letters, which are prestored in the dictionary. The codeword corresponding to each letter is then selected from the dictionary and sent to the modulator 18. A word is considered to be an interval delimited by spaces or specific symbols. When a word is treated as a new word it is coded according to its constituent letters and sent to the modulator 18. It is also entered as a new word by the new-word entry means 16, and assigned an occurrence frequency count by the occurrence frequency calculation means 17.

The new words that arise are assigned codewords among the words and letters already entered in the dictionary 15, with short codewords being assigned to frequently-occurring words and longer codewords to less-frequently-occurring words. When a new word is entered, if there is already a word with the same frequency of occurrence, there is a high probability that the new word will appear in the same text, so it is assigned the shortest codeword in the same occurrence-frequency group to increase the effectiveness of data compression.

The data sent from the modulator 18 as described above traverse the transmission channel 110 and are demodulated by the demodulator 111. The searching means 113 searches the dictionary 114, which is identical to the dictionary 15, for the codeword matching of each word of the demodulated data. If the codeword is found, the word corresponding to the codeword is sent to the receiving terminal 117. When data are received from the receiving demodulator 111 as a series of letters delimited by spaces or specific symbols, they are entered as a new word by the same procedure as at the transmitting end, so the dictionaries at the transmitting and receiving ends are kept the same.

As explained above, the above embodiment achieves a high data compression ratio by assigning short data to words with a high frequency of occurrence, using results obtained by new-word entry means and occurrence-frequency calculation means from the input words.

Figure 4:
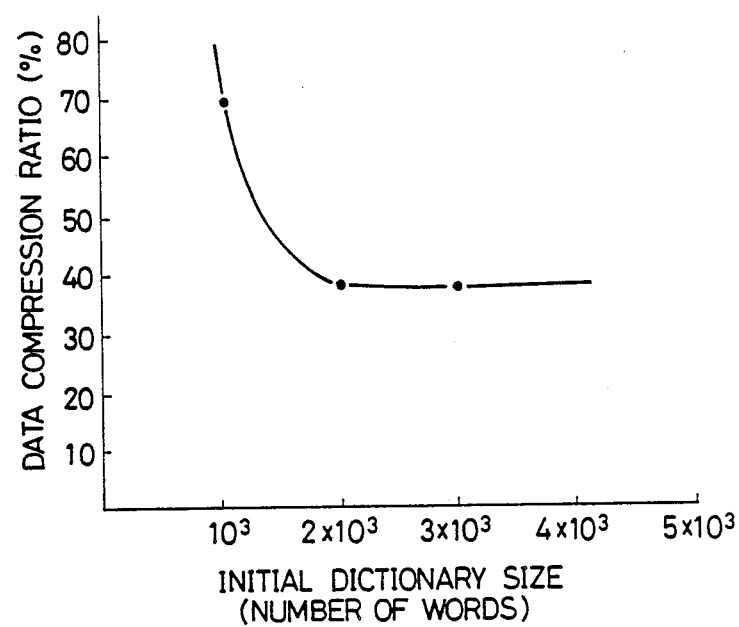
FIG. 4 shows results of a simulation study of data compression by this invention.

FIG. 4 show the results of a simulation study of the data compression ratio when the data compression method of this invention is applied using dictionaries with various numbers of initial entries. These results show a ratio of about 38% when the initial number of entries is 2000 or more, and indicate that a larger number of initial entries is unnecessary. Data compression efficiency can be further increased by excluding very infrequently-used words when codewords are assigned in the dictionary.

The embodiment described above was applied to English text, but it can also be applied to Japanese and other foreign languages.

Figure 1:
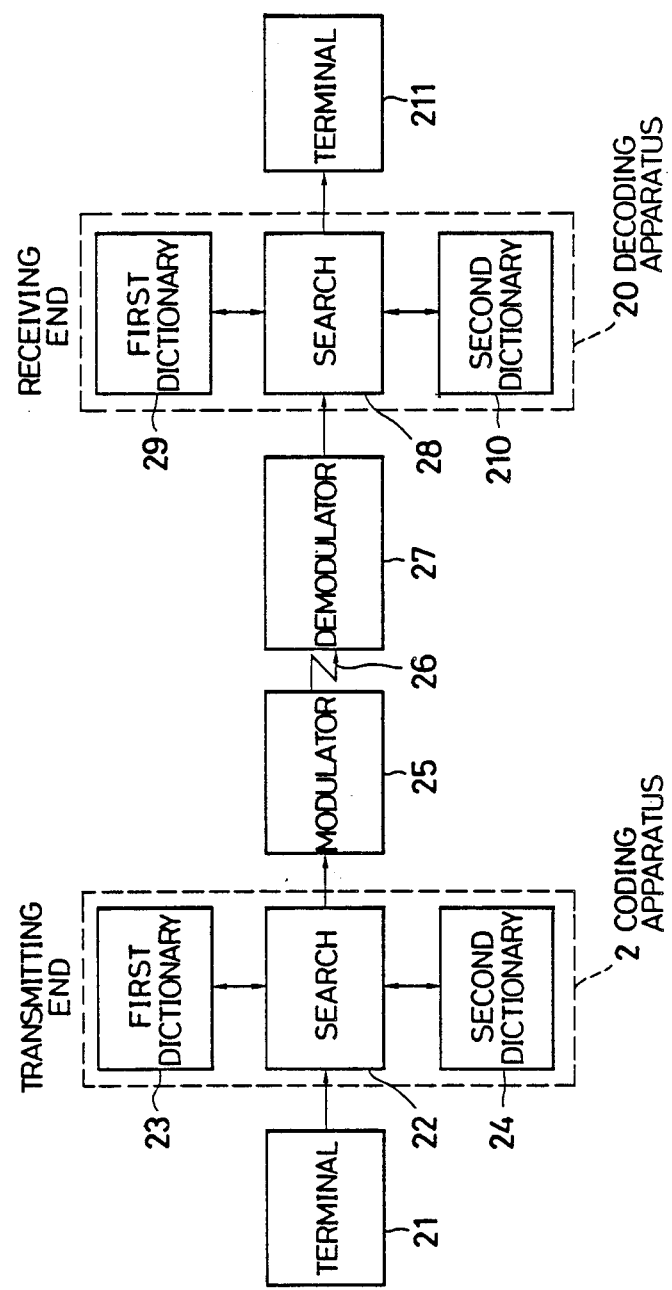
FIG. 1 is a block diagram of the data compression method of the prior art.
Figure 2:
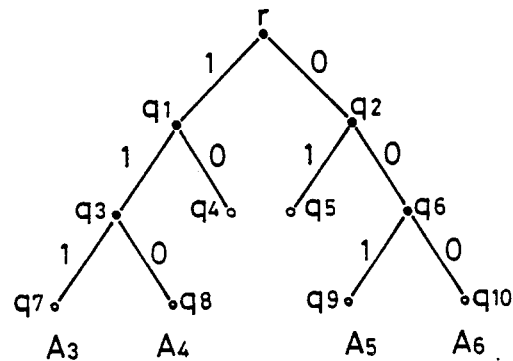
FIG. 2 illustrates the tree structure of the prior art of adaptive Huffman coding.
Figure 5:
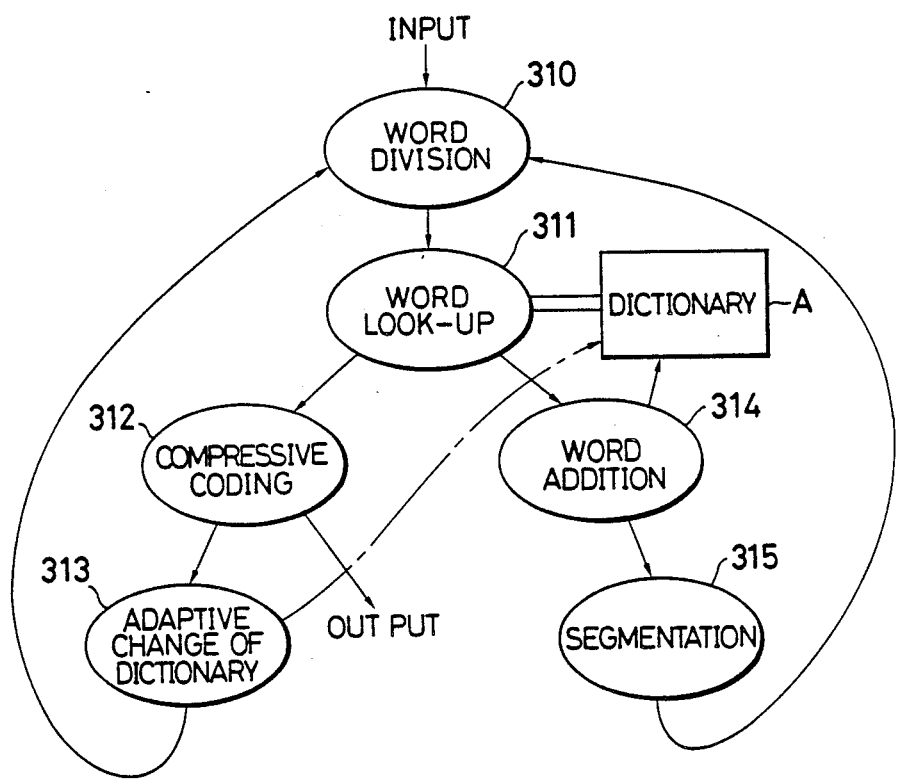
FIG. 5 is a state transition diagram for explaining another embodiment of the present invention.

FIG. 5 is a state transition diagram of a second embodiment of this invention. In state 310 the English text data to be transmitted are divided into words according to a fixed rule. Specifically, in state 310 the input English text data are divided at spaces or specific symbols, and consecutive spaces are expressed by a space symbol and the number of spaces. A word thus consists of a consecutive string of characters from the 26 letters of the alphabet, the distinction between upper case and lower case being ignored. In state 311, the first dictionary is searched to see if it contains the words obtained in state 310.

When a word is found in the dictionary, a compressed codeword is generated in state 312 and output. Following state 312 or in parallel with it, in state 313 the dictionary data are altered adaptively by switching compressed codewords according to occurrence counts and making other changes.

When a word is not found in the dictionary, it is added to the dictionary in state 314. The number of words that can be added is limited. When the limit is exceeded, one of the words occurring least frequently in the current English text data is deleted, and the new word is entered in its place.

The next transition is to state 315, in which the word is divided into fixed length segments or fixed numbers of characters. Each segment is put through states 310 and 313. If the segment is found in the dictionary, the process proceeds through states 312 and 313, then returns to state 310. If the segment is not found in the dictionary, it is divided into segments of a smaller fixed number of characters. Then a search is made to find whether or not each of the segments has a corresponding entry in the dictionary. If a segment is still not found it is further subdivided. The subdivision process is repeated until the minimum constituent elements of the word are reached. All of the minimum constituent elements of the data to be transmitted are present in the dictionary, so in the end compressive coding is carried out on these elements.

In this embodiment, when a word is segmented it is first divided into two-character segments, then into one-character segments. FIG. 6 shows how the initial dictionary data are stored in a read-only memory (ROM). The ordinary words stored in this embodiment are 2100 commonly-used words made up of the 26 letters of the alphabet. Since the length of the segments in state 315 are one and two characters, 800 two-character pseudowords and 128 one-character pseudowords (one for each character) are regarded as words and stored.

The two-character pseudowords include all 26×26 combinations of the letters of the alphabet.

The data associated with the words $A_1$ to $A_6$ include the compressed codewords $B_1$ to $B_6$, occurrence counts $C_1$ to $C_6$ derived from a survey of the probability of occurrence of the words in a variety of English texts, and one of three weights $W_0$, $W_1$, or $W_2$.

The compressed codewords $B_1$ to $B_6$ are preassigned according to the adaptive Huffman coding method. $P_0$, $P_1$ and $P_2$ are word category symbols added for purpose of explanation, indicating ordinary words, one-character pseudowords, and two character pseudowords, respectively. The weights $W_0$, $W_1$, and $W_2$ are set according to the probability of occurrence of the word categories $P_0$, $P_1$, and $P_2$. The ratio of words found among the 2100 ordinary words to words not found is approximately 7:2. When a word is not found among the ordinary words, the ratio of successful searches among the 800 two-character pseudowords to unsuccessful searches (cases in which the search proceeds to a one-character pseudoword) is approximately 9:2. In order to use simple integer ratios, $W_0:W_1:W_2=16:1:5$.

To shorten the word search time, words equal to or greater than two characters in length are classified in a hierarchical manner.

In this embodiment the two-character combinations of the 26 letters of the alphabet are used as the highest-level classification headers. The highest-level headers contain an address for each character length. The second-level headers contain the address of the first word in each group of words having the same character length.

Figure 7:
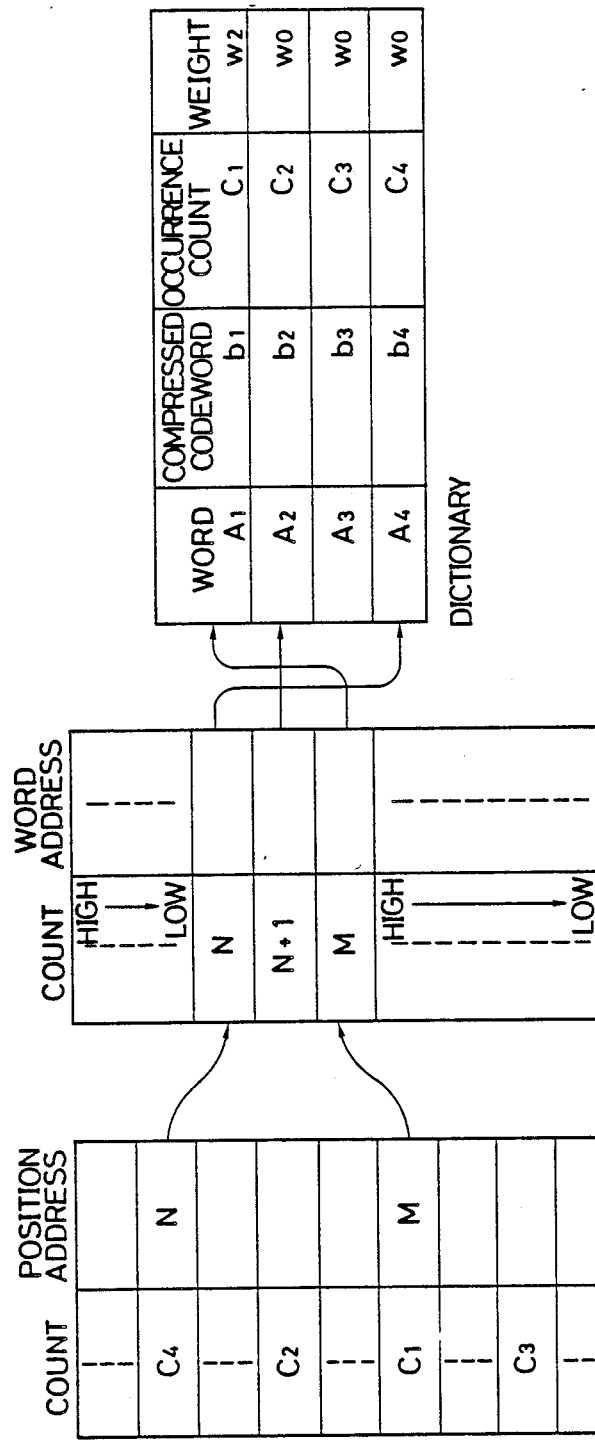
FIG. 7 is an explanatory diagram of the adaptive changes.

FIG. 7 explains the adaptive changes made in state 313 in FIG. 5. The symbols $b_1$ to $b_4$, $c_1$ to $c_4$, and $w_0$ to $w_2$ correspond to $B_1$ to $B_4$, $C_1$ to $C_4$ and $W_0$ to $W_2$ in FIG. 6. Each time an English data text is sent, the dictionary data are read from the read-only memory into a writable memory. Small letters are used to indicate the data in the writable memory.

In table $T_1$ in FIG. 7, the address of all the words are listed in order of frequency of occurrence of the word. (Words occurring with equal frequency are listed in arbitarary order.) Table $T_2$ lists all possible occurrence counts and the address of the position in table $T_1$ of each count (the first address if there are several equivalent positions). It is assumed that word $A_1$ has just been found in the dictionary and at this time the occurrence counts are $c_4>c_2>c_1>c_3$.

The adaptive change process starts by obtaining the value of the occurrence count $c_1$ of word $A_1$ plus its weight $w_2$ (=5).

If the result is that $c_1+w_2=c_4$, then the addresses N and M of the positions corresponding to occurrence counts $c_1$ and $c_4$ are obtained from table $T_2$.

Next the word $A_4$ corresponding to position N, the word $A_2$ corresponding to position N+1, and finally the word $A_1$ corresponding to position M are obtained from table $T_1$, and it is found that the order relation of their occurrence frequencies is $(A_4-A_2-A_1)$.

Among these three words the one newly used is regarded as having the highest frequency, so the compressed codewords are exchanged by reassigning $b_4$, $b_2$ and $b_1$ to $A_1$, $A_4$, and $A_2$ in that order. The adaptive change ends by updating the occurrence count of $A_1$ to $c_1+w_2$.

In this embodiment the weights $w_0$ to $w_3$ themselves are also changed adaptively.

At the current time, the rule is that ordinary words should be found in the dictionary 16 times out of 22 ($=w_0+w_1+w_2$). If large departures from this ratio continue, the weights are changed based on counts of the number of times ordinary words are found and the number of times two-character pseudowords are found.

Figure 8:
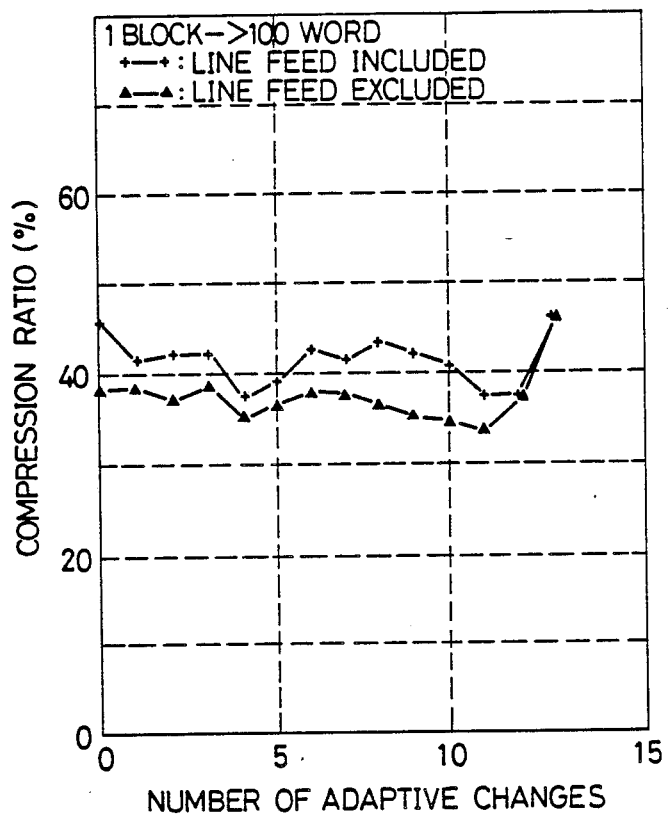
FIG. 8 shows a sample of data compression results.

FIG. 8 shows the result of compression of an issue of the magazine *Newsweek* containing sixty-two thousand words. The compression ratio as measured against the source bit length was 40% with line feeds included, 37% with line feeds excluded. This compares with the compression ratio of 65% generally attained when the known Huffman method is utilized to effect character-by-character compression of all the 256 characters.

Although the lengths of the segments into which words are divided in this embodiment are two characters and one character, segments of lengths from three characters to one character or other comparatively small numbers of characters could be used.

Instead of classifying words by combinations of letters and character lengths to shorten the dictionary search, for "kanji" (Chinese characters as used in Japanese) data it is possible to classify characters by their left- and right-hand radicals, or by parts of speech if grammatical information is obtainable.

As is clear from the preceding description, while preserving the advantage of assigning compressed codewords according to the frequency of occurrence of the source words, the above-described embodiment enables words not found as ordinary words in the dictionary to be compressively coded through division into segments of fixed lengths, thereby saving memory space, speeding up the searching of dictionary data, and improving the degree of compression of the transmitted data. The embodiment can be applied in the field of data communication if the state transitions described above are implemented at both the transmitting and receiving ends. If the initial data are made secret, encryption of the transmitted data can be combined with high-efficiency data compression, so with special initial dictionary data this invention can also be applied to apparatus for writing IC cards.

What is claimed is:

1. A method of compressing text data including character codes, comprising the steps of:

extracting input words from the text data, each input word including a series of word codes composed of one or more character codes;

providing a dictionary containing, as entries, words composed of characters;

storing a word code in association with each of said words contained in said dictionary;

storing occurrence counts of respective words contained in the text data to be compressed;

searching said dictionary to determine whether a selected input word from the text data to be compressed matches any of said words contained in said dictionary;

producing, if said selected input word is determined to match any of said words contained in said dictionary, the word code assigned to the word contained in said dictionary which said input word has been found to match;

updating, if said selected input word is determined to match any of said words contained in said dictionary, the respective one of said occurrence counts of said word contained in said dictionary which said input word has been found to match; and entering, if said input word is not determined to match any of said words in said dictionary, said input word as a new word in said dictionary.

2. A method according to claim 1, further comprising the step of:

assigning to said new word entered in said dictionary a word code whose data length is the shortest among those ones of said words which exist in said dictionary which have an occurrence count which is equal to the occurrence count of said new word.

3. A method according to claim 1, further comprising the step of:

when said new word is to be entered in said dictionary and said dictionary is already full, removing from said dictionary a word having a relatively low occurrence count prior to entering said new word in said dictionary.

4. A method as set forth in claim 1, further comprising said steps of:

in the step of prividing said dictionary, storing in said dictionary, in addition to ordinary words composed of characters, pseudowords of at least two different fixed lengths including lengths of one character and two characters;

dividing, if said selected input word is not found to match any of said ordinary words contained in said dictionary, said selected input word into segments of a fixed length;

searching said dictionary for each of said segments of said selected input word in turn to determine whether each of said segments of said selected word matches any of said pseudowords stored in said dictionary;

outputting, if during searching a given one of said segments of said selected word is determined to match one of said pseudowords, a word code corresponding to said pseudoword which said given one of said segments of said input word has been found to match; and entering said input word that has not been found to match any of said ordinary words as a new ordinary word in said dictionary.

* * * * *